(12) United States Patent
Cummings et al.

(10) Patent No.: US 6,429,390 B1
(45) Date of Patent: Aug. 6, 2002

(54) STRUCTURE AND METHOD FOR FORMING THE SAME OF A PRINTED WIRING BOARD HAVING BUILT-IN INSPECTION AIDS

(75) Inventors: Michael J. Cummings, Vestal; Robert J. Lerner, Endwell; Michael V. Longo, Glen Aubrey; Andrew M. Seman, Kirkwood; Raymond C. Tompkins, Vestal; Timothy L. Wells, Apalachin, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/804,535

(22) Filed: Mar. 12, 2001

(51) Int. Cl.$^7$ .............................. H01R 12/04; H05K 1/11
(52) U.S. Cl. ....................................... 174/261
(58) Field of Search ................ 361/767–771, 361/774; 174/260, 261

(56) References Cited

U.S. PATENT DOCUMENTS

| | | | | |
|---|---|---|---|---|
| 4,799,175 A | | 1/1989 | Sano et al. ................. 364/552 |
| 5,381,307 A | * | 1/1995 | Hertz et al. ................. 361/767 |
| 5,385,289 A | | 1/1995 | Bloch et al. ................. 228/103 |
| 5,643,835 A | | 7/1997 | Chia et al. ................. 437/211 |
| 5,650,660 A | | 7/1997 | Barrow ........................ 257/668 |
| 5,829,124 A | | 11/1998 | Kresge et al. ................. 29/840 |
| 5,982,468 A | | 11/1999 | Satou et al. ................. 349/150 |
| 6,066,808 A | | 5/2000 | Kresge et al. ............... 174/262 |
| 6,087,717 A | | 7/2000 | Ano et al. .................... 257/684 |
| 6,271,481 B1 | * | 8/2001 | Goenka et al. ............. 174/261 |

FOREIGN PATENT DOCUMENTS

JP        1-260884 A    10/1989

* cited by examiner

Primary Examiner—Kamand Cuneo
Assistant Examiner—Jeremy Norris
(74) Attorney, Agent, or Firm—William N. Hogg

(57) ABSTRACT

A wiring board for mounting an electrical device, which has an array of connectors thereon arranged in a grid pattern, wherein the connectors have at least two levels of criticality of connection to the substrate. The substrate has a plurality of mounting structure or features arranged in the same grid pattern to connect with the array of connectors on the electrical device. The mounting structures or features are divided into a plurality of at least two groups, with each group corresponding to a level of criticality of the connectors on the device. Each group of mounting structures has a discernible feature differing from each other group, to thereby permit different levels of inspection criteria for each group. The invention also contemplates a method of forming a substrate having the features for connecting the connectors on the device that have different levels of criticality

20 Claims, 2 Drawing Sheets

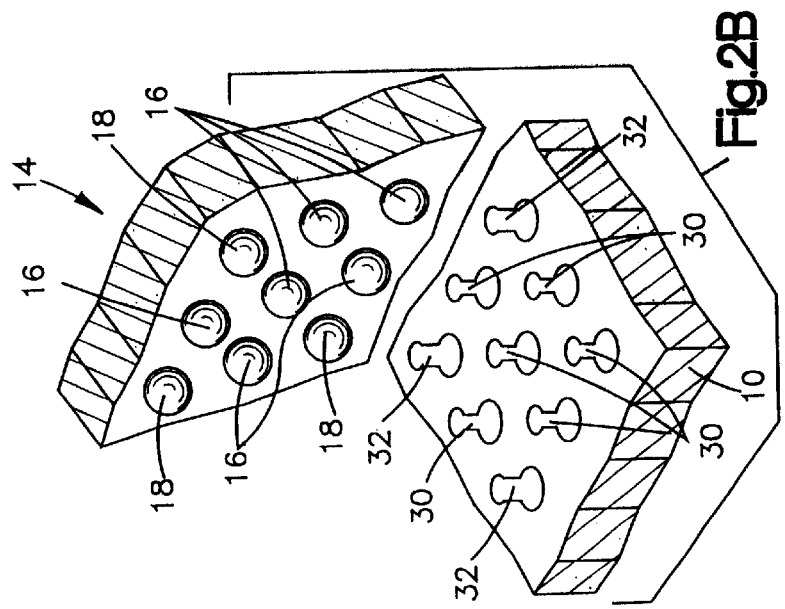
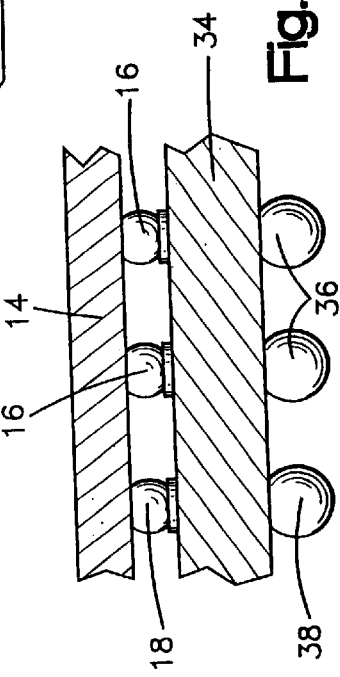
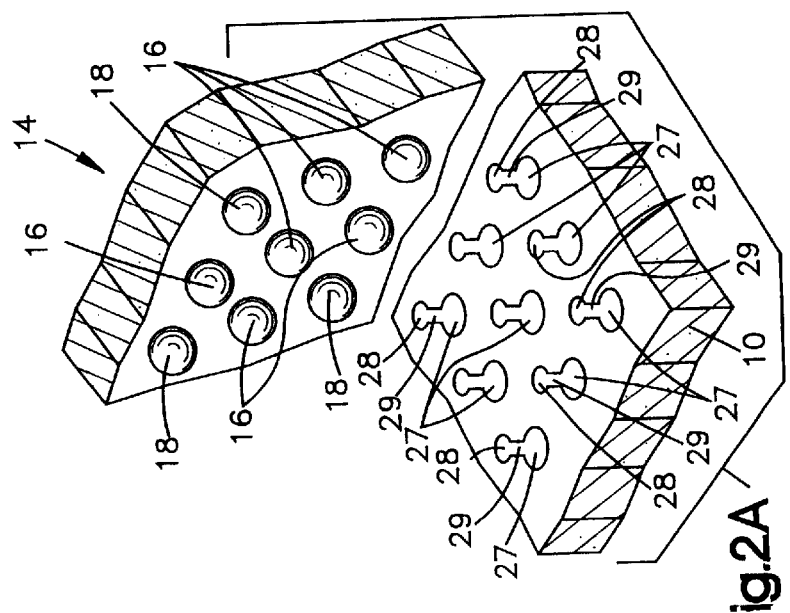

STRUCTURE AND METHOD FOR FORMING THE SAME OF A PRINTED WIRING BOARD HAVING BUILT-IN INSPECTION AIDS

FIELD OF THE INVENTION

This invention relates generally to printed wiring board and, more particularly, to a technique of forming printed wiring boards and the resulting board to provide built-in inspection aids based on the criticality of the various device joining structures on the printed wiring board.

BACKGROUND INFORMATION

Present day printed circuit boards have many types of discrete components attached or mounted to them. Some components are surface mounted to metal features, usually formed with a photolithographic process using various techniques, such as solder, wire bond, mechanical compression, as well as other techniques, while others are inserted into holes previously drilled and metal plated. In most cases, there are a multitude of connection points between the component and the printed circuit board on some fixed and repetitive grid patterns. A typical grid may be a matrix of pads, such as a ball grid array, as well as others, with centerlines on the order of 0.050 inch to 0.100 inch apart. Much testing and inspection of these features at many different stages is performed to insure that they meet a predetermined defect criteria for items, such as metal voiding, missing metallization, size, contamination as well as may other criteria. The past practice has treated all the features in the grid with the same degree of criticality during the board inspection process, and defective parts are either scrapped or repaired according to quality specifications which are of the highest quality. Connections on the I/C chips are typically provided for all the attachment structures in the grid.

However, all of the connections on the chips and, hence, all of the corresponding features or attachment structures in a specific grid array may not be actually electrically functional or may have a redundant function to others on the same chip or printed circuit board. In fact, in many grid arrays of component mounting features, there are more non-critical features than critical features. Generally speaking, a non-critical feature is one where the pad is not used for electrical function or is used for a redundant function for other features on the pad. It should be noted that while many of the connections may be less critical from an electrical or circuit point of view, nevertheless in the design of the circuit board, the features are included for several reasons. First, they may be necessary for providing structural integrity to the chip. Second, the features may be necessary for future use, such as engineering changes. Thus, they are present.

Which mounting features or mounting structures are critical and which are not critical is not readily obvious to the equipment or operator inspecting the board. Therefore, defects in non-critical features frequently result in the board being scrapped or repaired unnecessarily. In high volume manufacturing environments, processing many part numbers with different types of component mounting scenarios and varying levels of human expertise, mapping of each individual part number's functional features is not practically accomplished. Therefore, there is a need to identify which features or mounting structures are critical and which are not during the inspection phase, so that the boards need not be rejected because of defects in non-critical features or mounting structures.

SUMMARY OF THE INVENTION

According to the present invention, a wiring board for mounting an electrical device, which has an array of connectors thereon arranged in a grid pattern, is provided, wherein the connectors have at least two levels of criticality of connection to the substrate. The substrate has a plurality of mounting structures or features arranged in the same grid pattern to connect with the array of connectors on the electrical device. The mounting structures or features are divided into a plurality of at least two groups, with each group corresponding to a level of criticality of the connectors on the device. Each group of mounting structures has a discernible feature differing from each other group, to thereby permit different levels of inspection criteria for each group. The invention also contemplates a method of forming a substrate having the features for connecting the connectors on the device that have different levels of criticality.

DESCRIPTION OF THE FIGURES

FIG. 2a is a perspective view of a portion of a substrate having mounting structures which include pads connected to vias and a portion of an I/C chip for mounting on the substrate according to the prior art;

FIG. 2b is a view similar to FIG. 2a showing mounting structures with pads connected to vias according to the present invention; and FIG. 3 is a side elevational view of a portion of a chip carrier and a portion of an I/C chip showing various connection features on the chip and chip carrier.

DESCRIPTION OF THE PREFERRED EMBODIMENTS

Figure 1C:
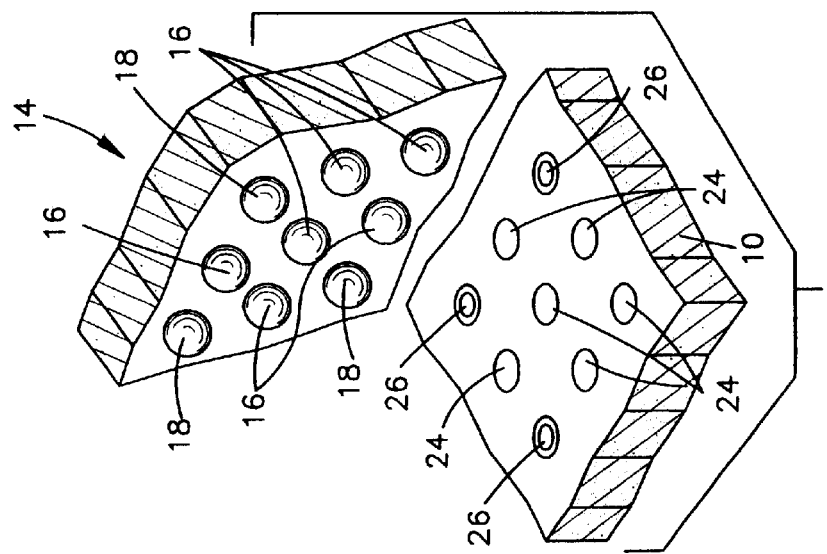
FIG. 1c is a view similar to FIG. 1a showing mounting features according to another embodiment of this invention.
Figure 1B:
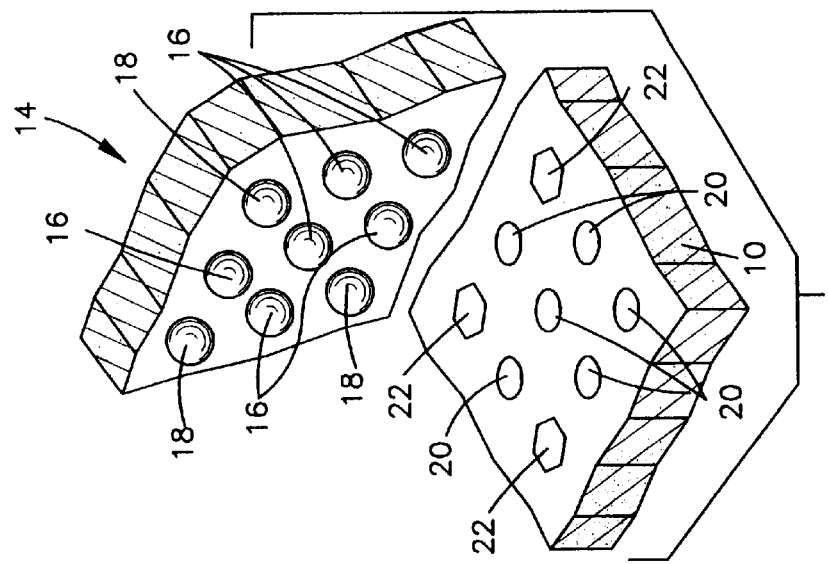
FIG. 1b is a view similar to FIG. 1a showing mounting features according to one embodiment of the present invention.
Figure 1A:
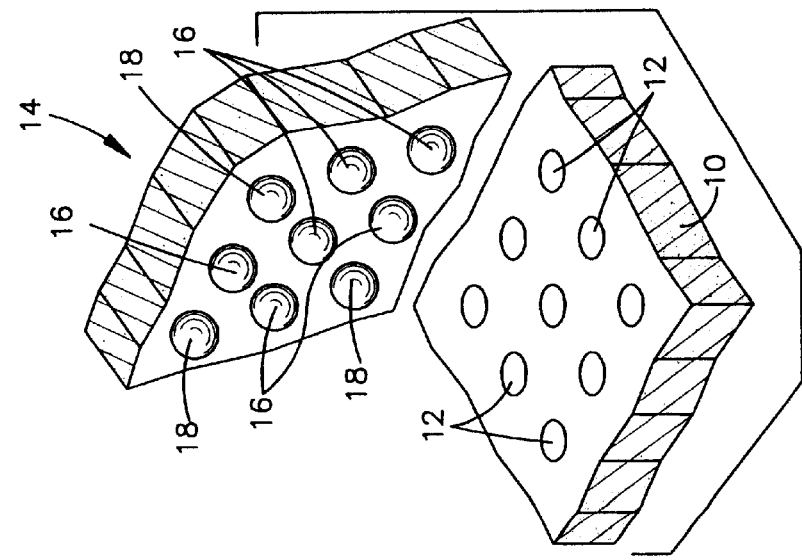
FIG. 1a is a perspective view of a portion of a substrate having mounting structures or features thereon and a portion of an I/C chip for mounting on the substrate according to the prior art.

Referring now to the drawings and, for the present, to FIG. 1a, a perspective view of a portion of a printed circuit wiring board and a portion of an I/C chip are shown somewhat diagrammatically. Printed Circuit wiring board includes a substrate 10 on which are formed connection pads 12. Although connection pads have taken various shapes for various functional reasons, a typical connection pad 12 is generally circular in shape and the connection pads 12 typically are arranged in a grid array to mount an electrical device, such as an I/C chip 14. (While the invention is described in conjunction with an I/C chip, it is to be understood that it is equally useful in connecting other electrical devices to a substrate.) I/C chip 14 has a plurality of connectors 16 and 18 which, in one embodiment, take the form of solder bumps which can be solder reflowed to join the I/C chip 14 to the connection pads 12. (Only a few connectors 16, 18 and connection pads 12 are shown for illustration. However, many more connectors 16, 18 and connection pads 12 are typically present on a chip and substrate.)

Connectors 16 and 18 on the I/C chip 14 are generally identical in shape, although some of them are critical connectors, which connectors are designated as connectors 16, and some are non-critical connectors, which connectors are designated as connectors 18. Generally speaking, the critical connectors are those which perform or are involved in an electrical function or carry an electrical signal as a primary connector. Non-critical connectors which are designated as 18 generally are connectors on the chip which serve no electrical function or which serve only a redundant function to some of the connectors 16. Thus, while it is critical that the connectors 16 make good, solid electrical contact with the contact pads 12 on the substrate 10, such is not the case of connectors 18 which, if not formed to a good, solid electrical contact, is not critical and the chip 14 will still function.

If the connection pads 12 on the substrate 10 are all similarly sized and shaped, then, unless one has a visual map or other mapping device of the connectors 16 and 18 on the chip 14, the inspector will inspect each of the connection pads 12 to the same criteria, which has to be the highest criteria needed for the connectors 16. This is a difficult task and, generally, is beyond the skill of the people making the inspection. Therefore, it is conventional practice to reject and scrap or return for rework substrates 10 which have defects in any of the connection pads 12 whether or not they are connected to critical connectors 16 or non-critical connectors 18 on the I/C chip 14.

According to the invention, one embodiment which is shown in FIG. 1b has connector pads that are arranged in the same grid pattern as in FIG. 1a, i.e. the same grid array to mate with the connectors 16 and 18 of the I/C chip 14. However, in this embodiment of the present invention, connector pads 20 are formed of one shape, i.e. a circle, and connector pads 22 are formed of another shape, i.e. a hexagon (although these shapes are arbitrary), the connector pads 20 being positioned to mate with the connectors 16 on the I/C chip 14 and connector pads 22 being positioned to mate with the connectors 18 on the I/C chip 14. Thus, during an inspection process, if the inspector should note that there are defects with respect to the connector pads 22, such as, but not limited to, metal voiding, missing metal, improper size, contamination and many other defects, these can be ignored since these connector pads 22 are non-critical. However, if the same type of defect is noticed in a connector pad 20 which is deemed critical, then the printed wiring board would be returned either for rework or scrapped. Hence, a great number of boards, which would otherwise be returned for rework or scrapped, can pass inspection since the defects noted therein are on the non-critical connector pads 22. Thus, both critical and non-critical pads are provided as needed for other purposes, but the inspection criteria are different.

FIG. 1c shows another embodiment of the present invention where connector pads 24 and 26 are provided, these connector pads 24 being critical connector pads to mate with the connectors 16 on the I/C chip 14, and the connector pads 26 being non-critical connector pads being positioned to mate with the connectors 18 on the I/C chip 14. In this embodiment, rather than being of a different external shape, the connector pads 24 are completely filled-in circles whereas the connector pads 26 are generally annular in shape or, expressed another way, have a centered void which will identify connector pads which are for the non-critical connectors 18.

FIG. 2a shows another type of connection or mounting structure for an I/C chip according to the prior art. In this case, connector pads 27 are connected to vias 28 through circuit lines 29. As in the embodiment of FIG. 1a, all of the connector pads 27 and circuit lines 29 are the same whether the pads 27 are to be connected to critical connectors 16 or non-critical connectors 18 on the I/C chip 14.

FIG. 2b shows how this type of mounting device can be formed to show critical and non-critical connections. In this embodiment, the connector pads 27 are all the same size and shape, i.e. circular, but other shapes could be used, and the vias 28 are all the same size and shape. However, there are different size circuit lines 30 and 32 leading to the vias 26. The circuit lines 30 are for connection to the pads which connect to connectors 16 of the I/C chip 14 and circuit lines 32 are for connection to the pads connected to connectors 18 of the I/C chip 14. In this case, the circuit lines 32 are wider than the circuit lines 30, thus affording an inspector an indication of which connector pads are for critical connectors and which are for non-critical connectors and, hence, allowing any defects to pass in the connector pads for connection to the non-critical connectors 18 of the I/C chip 14.

It should be understood that these are but a few of the techniques which can be used to provide the necessary differentiation between mounting structures which are to be connected to critical connectors 16 of the I/C chip 14 to non-critical connectors 18 of the I/C chip 14. The particular differentiation of features is not critical other than that the mounting structures to be mounted to the connectors 16 of the I/C chip must be differentiated in such a manner that they are discernable from those which are to be mounted to the connectors 18 of the I/C chip 14.

The invention has been described with respect to manual visual differentiation by human inspectors. However, other alternatives exist, such as automated optical inspection (AOI), where it is possible to program the tool to recognize and differentiate the shape variation between pads and treat the defect criteria differently between the two. For example, an algorithm can be written whereby defect criteria on a polygon-shaped pad would be treated differently by the AOL tool than on a round pad, etc.

The invention has been described in connection with mounting an I/C chip to a substrate. This can be either an I/C chip mounted directly to a printed wiring board or it can be an I/C chip mounted to a chip carrier 34, as shown in FIG. 3. Moreover, the chip carrier 34 shown in FIG. 3 can itself be the electrical device and the mounting of connectors 36 and 38 on the chip carrier can be mounted in the same way as connectors 16 and 18 on the chip 14 are mounted to a substrate 10 of a printed wiring board. Thus, it is possible that a chip carrier and a printed wiring board can have mounting structures which differentiate between critical and non-critical connections to an electrical device.

It should be noted that a particular method of forming the mounting structure on the substrate 10 is not critical and can be accomplished by any well known teachings used in the art, such as by photolithography using either positive or negative photoresist and using either additive plating or full panel plating and subtract etching, or any other technique which will provide the desired differentiation between the mounting structures on the substrate. Moreover, the mounting structures are not limited to those that can receive solder connections, but can be for wire bond, compression bonding, pin-in-hole and other type of connections.

It is also to be understood that the invention has been described with two levels of criticality; however, three or more levels of criticality can be accommodated by having a different discernible shape of mounting structure for each level of criticality.

While the discussion is centered around inspection of mounting features on a substrate, this invention is not limited to features which necessarily require mounting or connection. For example, there are instances of through holes and vias which have various levels of criticality which may not have any connection or component mounted to the through hole or via. There can be associated with that through hole or via a distinguishing mark or identification to enable an inspection or selected manufacturing operation to be performed associated with that through hole or via. A substrate does not necessarily have to be limited to a circuit board. Substrates could encompass various other types, such as semiconductor chips, flexible circuitized carriers, ceramic carriers, microwave carries, and so on. Features can be in various forms as well, such as transistors and components, microwave transmission and reception features, geometric shapes and trenches, and so on.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A substrate for mounting an electrical device having an array of connectors thereon arrayed in a grid pattern, and wherein said connectors have at least two levels of criticality of connection with respect to electrical conduction therethrough, comprising:

a plurality of mounting structures arranged in said grid pattern to connect with said array of connectors;

said mounting structure being divided into a plurality of at least two groups with each group corresponding to a level of criticality of said connectors;

each group of mounting structures having a unique discernible feature differing from each other group to thereby permit different levels of inspection criteria for each group.

2. The invention as defined in claim 1 wherein said mounting structure includes connector pads.

3. The invention as defined in claim 2 wherein the connector pads of each group have a different planar shape.

4. The invention as defined in claim 2 wherein said connector pads of each group have a visually discernible distinguishing feature.

5. The invention as defined in claim 2 wherein each connector pad is connected to a via, and wherein the connection with the pads of each group has features discernible from the connection of each other group.

6. The invention as defined in claim 1 wherein said electrical device is an I/C chip, and said substrate is a chip carrier.

7. The invention as defined in claim 1 wherein said electrical device is an I/C chip and said substrate is a printed circuit board.

8. The invention as defined in claim 1 wherein said electrical device is a component mounted on a carrier, and said substrate is a printed circuit board.

9. The invention as defined in claim 1 wherein said discernible features are visually discernible.

10. A method of providing inspection aids for inspecting substrates for mounting electrical devices having an array of connectors thereon arrayed in a grid pattern, and wherein said connectors have at least two levels of criticality of connection with respect to electrical conduction therethrough; comprising the steps of:

forming a plurality of mounting structures on said substrate in said grid pattern to connect with said array of connectors; and wherein said mounting structures are divided into a plurality of at least two groups with each group corresponding to a level of criticality of said connectors; and wherein the mounting structure of each group has a uniquely discernible feature differing from each other group to thereby form mounting structures to which different levels of inspection criteria can be applied.

11. The invention as defined in claim 10 wherein said mounting structure includes connector pads.

12. The invention as defined in claim 11 wherein the connector pads of each group have a different planar shape.

13. The invention as defined in claim 11 wherein said connector pads of each group have a visually discernible distinguishing feature.

14. The invention as defined in claim 11 wherein each connector pad is connected to a via, and wherein the connection with the pads of each group has features discernible from the connection of each other group.

15. The invention as defined in claim 10 wherein said electrical device is an I/C chip, and said substrate is a chip carrier.

16. The invention as defined in claim 10 wherein said electrical device is an I/C chip and said substrate is a printed circuit board.

17. The invention as defined in claim 10 wherein said electrical device is a component mounted on a carrier, and said substrate is a printed circuit board.

18. The invention as defined in claim 10 wherein said discernible features are visually discernible.

19. A substrate having a plurality of circuitized features thereon in a pattern, and wherein said pattern has at least two levels of criticality of function with respect to electrical conduction therethrougb, comprising:

said circuitized features being divided into a plurality of at least two groups of circuitized features with each group corresponding to a level of function of said circuitized features;

the features of said at least two groups having a unique discernible characteristic differing from each other group to thereby permit different levels of selection criteria for each group.

20. The substrate as defined in claim 19 wherein said selection criteria include a visual inspection.

* * * * *